US009917383B1

(12) United States Patent
Chen

(10) Patent No.: US 9,917,383 B1
(45) Date of Patent: Mar. 13, 2018

(54) PRINTED CIRCUIT ASSEMBLIES WITH AN ELONGATED CUT-OUT

(71) Applicant: HEWLETT PACKARD ENTERPRISE DEVELOPMENT LP, Houston, TX (US)

(72) Inventor: Jui Lin Chen, Taipei (TW)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/494,398

(22) Filed: Apr. 21, 2017

(51) Int. Cl.
| H01R 12/00 | (2006.01) |
| H01R 12/70 | (2011.01) |
| G06F 1/18 | (2006.01) |
| H05K 7/20 | (2006.01) |
| H01R 12/67 | (2011.01) |
| H05K 3/00 | (2006.01) |
| C25D 17/08 | (2006.01) |
| B23K 101/42 | (2006.01) |

(52) U.S. Cl.
CPC ......... *H01R 12/7005* (2013.01); *C25D 17/08* (2013.01); *G06F 1/183* (2013.01); *H01R 12/675* (2013.01); *H05K 3/0052* (2013.01); *H05K 7/20436* (2013.01); *B23K 2201/42* (2013.01)

(58) Field of Classification Search
CPC ...... H01R 12/57; H01R 23/722; H01R 33/09; H05K 7/1092
USPC ...................................... 439/83, 69–71, 575
See application file for complete search history.

(56) References Cited

U.S. PATENT DOCUMENTS

| 4,832,619 A | 5/1989 | Eck |
| 5,172,306 A | 12/1992 | Cantrell |
| 6,008,995 A | 12/1999 | Pusateri |
| 7,789,693 B2 * | 9/2010 | Liao ..................... H05K 7/1053 439/331 |
| 8,295,042 B2 * | 10/2012 | Cheng ..................... G06F 1/20 361/679.46 |
| 8,737,054 B2 | 5/2014 | Zhou |
| 2005/0074992 A1 * | 4/2005 | Chu ..................... G01R 1/0433 439/70 |
| 2009/0185336 A1 * | 7/2009 | Karim .................... H02B 1/052 361/652 |
| 2013/0178075 A1 * | 7/2013 | Hsueh ................. H01R 12/721 439/62 |

FOREIGN PATENT DOCUMENTS

| WO | WO-2015047299 A1 | 4/2015 |
| WO | WO-2015084316 | 6/2015 |

OTHER PUBLICATIONS

Veronica Luijten, "M.2 (NGFF) Connectors—TE Connectivity," Retrieved from Internet Dec. 18, 2015, 3 pps., <http://www.rs-online.com/designspark/electronics/knowledge-item/m-2-ngff-connectors-te-connectivity>.

* cited by examiner

*Primary Examiner* — Phuong Chi T Nguyen
(74) *Attorney, Agent, or Firm* — Hewlett Packard Enterprise Patent Department

(57) ABSTRACT

Examples herein relate to printed circuit assemblies (PCA's). In one example, a PCA comprises a printed circuit board (PCB) having an elongated cut-out, the cut-out defining a first and a second opposite elongated edges on the PCB, a movable bracket having a standoff established on a surface of the movable bracket, the movable bracket connecting to the first and the second opposite elongated edges and a platform connector established on the PCB.

20 Claims, 7 Drawing Sheets

PRINTED CIRCUIT ASSEMBLIES WITH AN ELONGATED CUT-OUT

BACKGROUND

The use of different printed circuit assemblies (PCA's) having different lengths may be used to allocate modules (e.g., electronic expansion cards) having different lengths. In this respect, there is an existing demand for designers to develop a universal PCA design that can accommodate a large number of modules having different lengths.

BRIEF DESCRIPTION OF THE DRAWINGS

The following detailed description references the drawings, wherein.

DETAILED DESCRIPTION

The examples of PCA's according to the present disclosure include a PCA having a cut-out wherein a module can be allocated, a movable bracket having a standoff and a connector.

Figure 1:
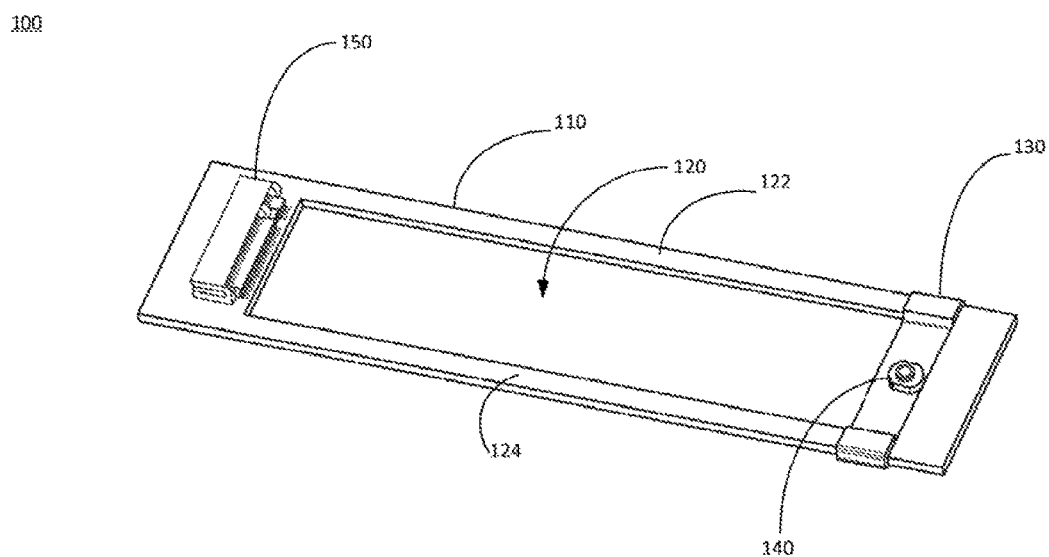
FIG. 1 illustrates an example of a PCA according to the present disclosure.

FIG. 1 shows an example of a PCA 100 according to the present disclosure. In particular, the PCA 100 comprises a printed circuit board (PCB) 110 having an elongated cut-out 120. The cut-out 120 can define a first and a second opposite elongated edges 122 and 124 in the PCB 110. Furthermore, the PCA 100 comprises a platform connector 150 that can be adapted to plug-in an electronic module (not shown) and a movable bracket 130 having a standoff 140 established on the surface of the movable bracket 130, the movable bracket 130 can connect to the first and the second opposite elongates edges 122 and 124 as shown in FIG. 1.

Figure 2:
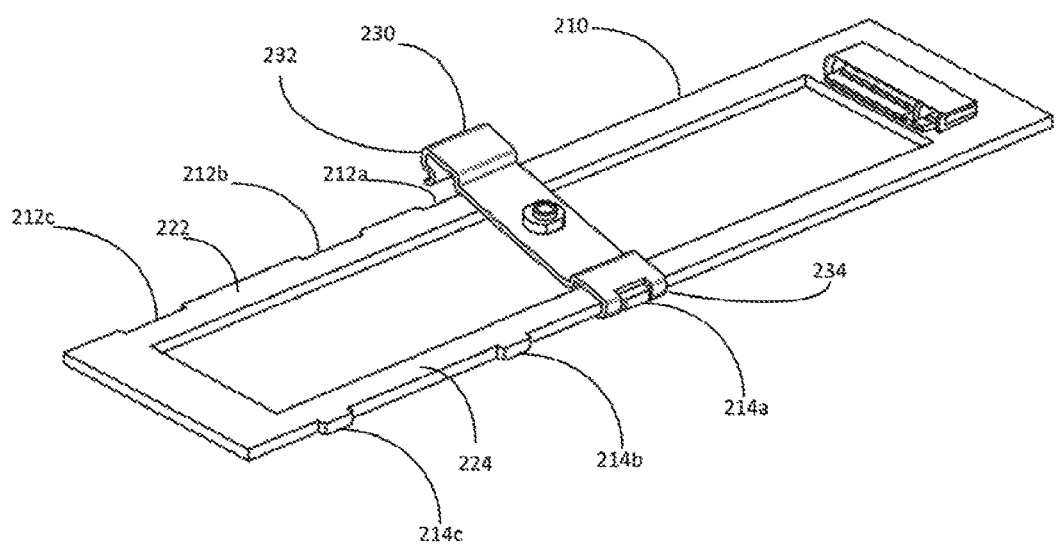
FIG. 2 illustrates another example of a PCA according to the present disclosure.

FIG. 2 shows another example of a PCA 200 according to the present disclosure. In this particular example, the first and the second opposite elongated edges 222 and 224 comprises attachment features. In particular the first elongated edge 222 comprises attachments feature as e.g. notches 212a, 212b and 212c and the second elongated edge 224 comprises attachment features as e.g. protrusions 214a, 214b and 214c. Other types of attachments features as e.g. slots could be used. Furthermore, any combination of attachment features (e.g. notches, protrusions, slots, etc.) could be established on the first and the second edges of the PCB 210 or at least on the first or on the second edge of the PCB 210.

The PCA 200 of FIG. 2 further comprises a movable bracket 230. The movable bracket 230 comprises mechanical attachment features 232 and 234. Mechanical attachment feature 232 can interact with the mechanical attachment features (e.g. notches) 212a to 212c of the first elongated edge 222 and mechanical attachment feature 234 can interact with the mechanical attachment features (e.g. protrusions) 214a to 214c of elongated edge 224. Moveable bracket 230 is held in fixed position when the attachment features of moveable bracket 230 interact with the attachment features of elongated edges 222 and 224.

Figure 3A:
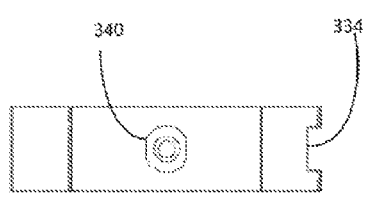
FIGS. 3A, 3B and 3C illustrate an example of a movable bracket according to the present disclosure.
Figure 3B:
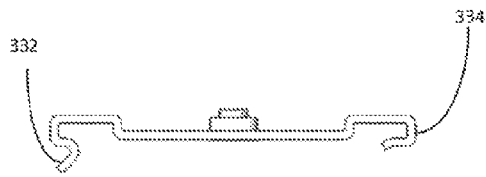
Figure 3C:
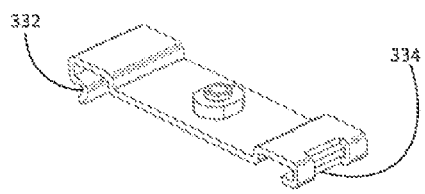

FIGS. 3A, 3B and 3C show three different views of a movable bracket 330 comprising mechanical attachment features as mentioned above in FIG. 2. In particular FIG. 3A is a top view of the movable bracket 330 having a standoff 340 established on its surface. FIG. 3B is a plan view of the movable bracket 330 that comprises a mechanical attachment feature 332 designed to interact with the notches 212a, 212b and 212c comprises in the first elongated edge 222. Furthermore, the movable bracket 330 further comprises another mechanical attachment feature 334 designed to interact with the protrusions 214a, 214b and 214c comprises in the second elongated edge 224. FIG. 3C shows an isometric view of the movable bracket 330 comprising attachment features 332 and 334. By means of the interaction between the attachment features of the PCB and the attachment features of the movable bracket 330 allows for a suitable fixation of the movable bracket 330 on the PCB to be achieved. Hence, the movable bracket 330 is adapted to be fixed to the PCB at different locations along the PCB by means of the mechanical attachment features of the elongated edges and the mechanical attachment features 332 and 334 of the movable bracket 330.

Figure 4A:
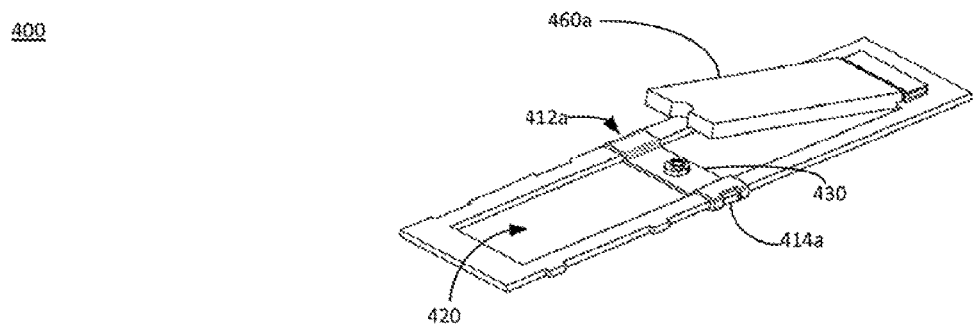
FIGS. 4A and 4B illustrate an example of a PCA allocating a module according to the present disclosure.
Figure 4B:
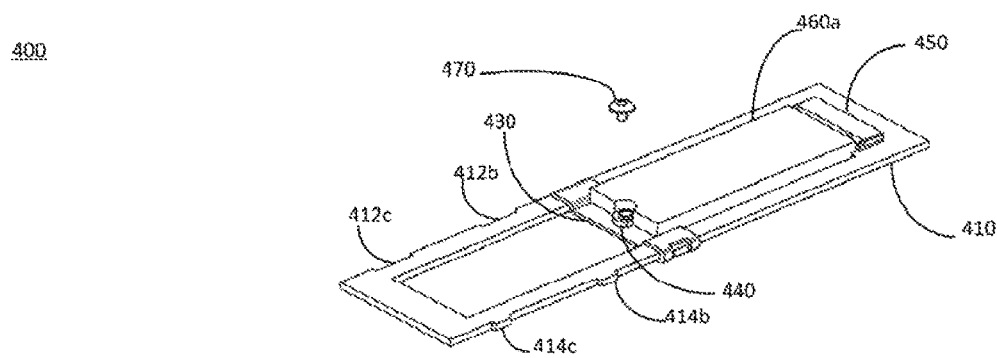

FIGS. 4A and 4B shows an example of a PCA 400 according to the present disclosure allocating a module 460a. FIGS. 4A and 4B shows that the PCA 400 is adapted to allocated a module 460a. The module 460a can be e.g. an expansion card. The length of the module can be e.g. one of 16 mm, 26 mm, 30 mm, 38 mm, 42 mm, 60 mm, 80 mm and 110 mm. Each length may be associated to a particular mechanical attachment feature on the elongated edges of PCA 400. For the examples shown in FIGS. 4A and 4B, the mechanical attachment features 412a and 414a of the elongated edges of PCA 400 can be associated with a module 460a having a length of 60 mm. The mechanical attachment features 412b and 414b can be associated with a module having a length of 80 mm and the mechanical attachment features 412c and 414c can be associated with a module having a length of 110 mm. An elongated cut-out 420 is adapted to allocate the module 460a as shown in FIG. 4A.

Furthermore, the PCA 400 comprises a platform connector 450 that can be adapted to plug-in the module 460a and a standoff 440 established on the surface of the movable bracket 430. The standoff 440 can be adapted to secure the module 460a to the PCB 410 of the PCA 400 by means of a screw 470.

Figure 5A:
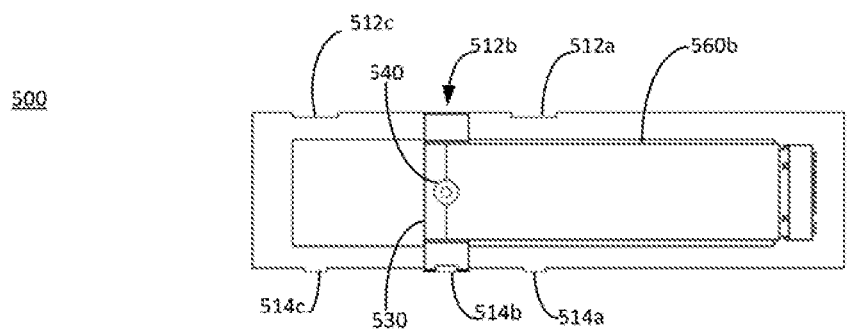
FIGS. 5A and 5B illustrate two examples of two PCA's allocating two modules according to the present disclosure.

FIG. 5A shows a PCA 500 allocating a module 560b having a length of 80 mm. The PCA 500 comprises a movable bracket 530 having mechanical attachment features that are designed to interact with the mechanical attachment features 512b and 514b in order to fix the module 560b with a length of 80 mm in place. Module 560b may be secured to the PCA 500 by a standoff 540 established on the surface of the movable bracket 530 and a screw (not shown).

In some implementations, the mechanical attachment features 512a and 514a can be associated with a module having a length of 60 mm. In some implementations, the mechanical attachment features 512c and 514c can be associated with a module having a length of 110 mm.

Figure 5B:
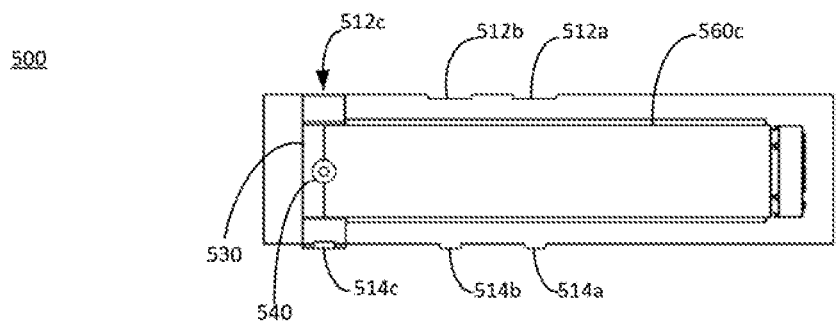

FIG. 5B shows a PCA 500 allocating a module 560c having a length of 110 mm. The PCA 500 comprises a movable bracket 530 having mechanical attachment features that are designed to interact with the mechanical attachment features 512c and 514c to fix the module 530c with a length of 110 mm in place. Module 560*c* may be secured to the PCA 500 by a standoff established on the surface of the movable bracket 530 and a screw (not shown).

In some implementations, the mechanical attachment features 512*a* and 514*a* can be associated with a module having a length of 60 mm. In some implementations, the mechanical attachment features 512*b* and 514*b* can be associated with a module having a length of 80 mm.

Figure 6:
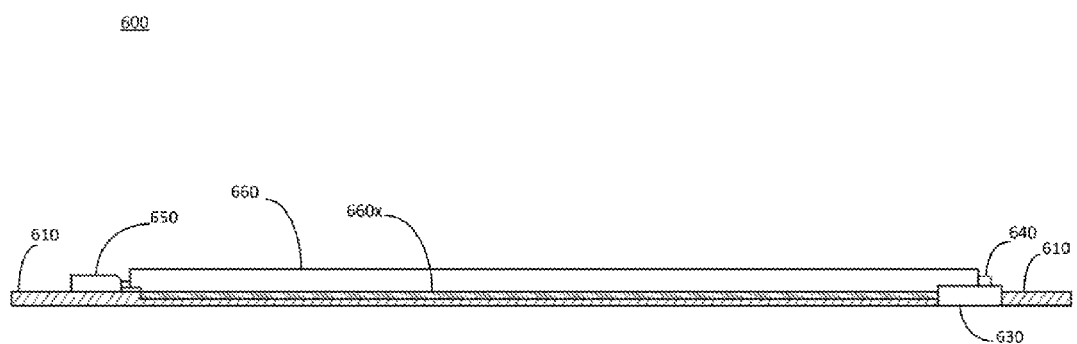
FIG. 6 illustrates an example of a PCA allocating a module according to the present disclosure.

FIG. 6 shows a side view of a PCA 600 with a module 660 allocated in the elongated cut-out of a PCB 610. The PCA 600 comprises a movable bracket 630, a standoff 640 established on the movable bracket 630 and a platform connector 650 adapted to plug-in module 660. As it is shown in FIG. 6, a part 660*x* of the module 660 is allocated under the surface of the PCB 610 due to the elongated cut-out of the PCB 610. In some examples, this may permit a reduction between 25% and 35% of the total thickness of the PCA 600 plus the module 660 as the part 660*x* of the module 660 may through the surface of the PCB 610.

Figure 7:
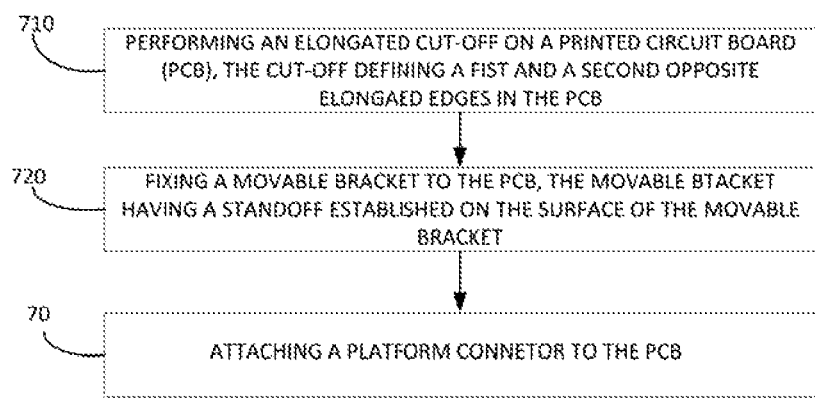
FIG. 7 illustrates an example of a flowchart for building a PCA according to the present disclosure.

FIG. 7 shows an example of a flowchart 700 for building a PCA according to the present disclosure. In particular the flowchart 700 comprises step 710 for forming an elongated cut-out on a PCB, the cut-out can define a first and a second opposite elongated edges in the PCB.

Furthermore, the flowchart 700 comprises step 720 for attaching a movable bracket of the PCB, the movable bracket having a standoff established on the surface on the movable bracket. The movable bracket can connect to the first and the second opposite elongated edges.

Furthermore, the flowchart 700 comprises step 730 for attaching a platform connector to the PCB. The module can be plugged in to the platform connector as shown in FIGS. 4A and 4B.

The flowchart 700 can further comprise a step for forming mechanical attachment features on the first and the second opposite elongated edges in the PCB as shown in FIGS. 2A and 2B. After forming the mechanical attachment features on the elongated edges of the PCB, during the step 720 for attaching the movable bracket to the PCB, mechanical attachment features established on the movable bracket as shown in FIGS. 3A to 3C can interact with the mechanical attachment features on the elongated edges of the PCB as shown in FIG. 2 to fix the movable bracket in place.

The flowchart 700 can further comprise a step for attaching a module to the PCA as shown in FIGS. 4A and 4B. Attaching the module to the PCA can comprise allocating the module in the elongated cut-out, plugging in the module to the platform connector, securing the module to the PCB by means of the standoff established on the surface of the movable bracket and a screw as shown in FIG. 4B.

The flowchart 700 can further comprise a step for moving the movable bracket along the PCB to a new location on the PCB and fixing the movable bracket to the PCB at the new location on the PCB as shown in FIGS. 5A and 5B.

Relative terms used to describe the structural features of the figures illustrated herein are in no way limiting to conceivable implementations. It is, of course, not possible to describe every conceivable combination of components or methods, but one of ordinary skill in the art will recognize that many further combinations and permutations are possible. Accordingly, the present disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

The invention claimed is:

1. A Printed Circuit Assembly (PCA), the PCA comprising:
    a Printed Circuit Board (PCB) having an elongated cut-out, the cut-out defining a first and a second opposite elongated edges in the PCB;
    a movable bracket having a standoff established on a surface of the movable bracket, the movable bracket connecting to the first and the second opposite elongated edges; and
    a platform connector established on the PCB.

2. The PCA of claim 1, wherein the PCA is adapted to allocate an electronics module.

3. The PCA of claim 1, wherein a length of the module comprises one of the following:
    16 mm;
    26 mm;
    30 mm;
    38 mm;
    42 mm;
    60 mm;
    80 mm; and
    110 mm.

4. The PCA of claim 3, wherein the standoff established on the surface of the movable bracket is adapted to secure the electronics module to the PCB using a screw.

5. The PCA of claim 1, wherein the first and the second opposite elongated edges of the PCB comprise mechanical attachment features.

6. The PCA of claim 5, wherein the mechanical attachment features are at least one of the following:
    a notch;
    a slot; and
    a protrusion.

7. The PCA of claim 6, wherein the movable bracket comprises mechanical attachment features that interact with the mechanical attachment features of the first and the second opposite elongated edges.

8. The PCA of claim 7, wherein the movable bracket is adapted to be fixed to the PCB at different locations along the PCB by the interaction of the mechanical attachment features on the movable bracket with the mechanical attachment features.

9. The PCA of claim 8, wherein the platform connector is adapted to plug-in the electronics module.

10. The PCA of claim 8, wherein the elongated cut-out is adapted to receive the electronics module.

11. The PCA of claim 8, wherein the electronics module is an electronics expansion card.

12. A method for building a PCA, the method comprising:
    forming an elongated cut-out in a Printed Circuit Board (PCB), the cut-out defining a first and a second opposite elongated edges in the PCB;
    attaching a movable bracket to the PCB, the movable bracket having a standoff established on a surface of the movable bracket,
    wherein the movable bracket connects to the first and the second opposite elongated edges; and
    attaching a platform connector to the PCB.

13. The method of claim 12, further comprising:
    moving the movable bracket along the PCB to a new location on the PCB; and
    fixing the movable bracket to the PCB on the new location on the PCB.

14. The method of claim 12, further comprising:
forming mechanical attachment features on the first and the second opposite elongated edges in the PCB.

15. The method of claim 14, wherein attaching the movable bracket to the PCB comprises interacting mechanical attachment features established on the movable bracket with the mechanical attachment features on the first and the second opposite elongated edges.

16. The method of claim 12, further comprising attaching an electronics module to the PCA.

17. The method of claim 16, wherein attaching the electronics module to the PCA comprises receiving the module in the elongated cut-out.

18. The method of claim 17, wherein attaching the electronics module to the PCA comprises plugging in the electronics module to the platform connector.

19. The method of claim 18, wherein attaching the electronics module to the PCA further comprises securing the electronics module to the PCB using the standoff established on the surface of the movable bracket.

20. The method of claim 19, wherein securing the electronics module to the PCB using the standoff comprises securing the PCB using a screw.

\* \* \* \* \*